(12) United States Patent
Miner

(10) Patent No.: US 6,639,801 B2
(45) Date of Patent: Oct. 28, 2003

(54) MECHANICAL PACKAGING ARCHITECTURE FOR HEAT DISSIPATION

(75) Inventor: Rene Miner, Dracut, MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/928,072

(22) Filed: Aug. 10, 2001

(65) Prior Publication Data

US 2003/0030983 A1 Feb. 13, 2003

(51) Int. Cl.[7] ............................................. H05K 7/20
(52) U.S. Cl. .................... 361/705; 174/252; 257/712; 361/719
(58) Field of Search .................. 174/252, 16.3; 165/80.2, 80.3, 185; 257/700, 709, 711, 712, 717, 723, 778; 361/704, 705, 707, 720, 717–719; 403/374, 409.1; 211/41.17

(56) References Cited

U.S. PATENT DOCUMENTS

| | | | | |
|---|---|---|---|---|
| 4,739,448 A | * | 4/1988 | Rowe et al. ................. | 361/719 |
| 5,798,909 A | * | 8/1998 | Bhatt et al. .................. | 361/764 |
| 5,801,923 A | * | 9/1998 | Nichols ....................... | 361/704 |
| 5,973,920 A | * | 10/1999 | Altic et al. .................. | 361/687 |
| 5,982,630 A | * | 11/1999 | Bhatia ......................... | 361/767 |
| 6,038,137 A | * | 3/2000 | Bhatt et al. .................. | 361/795 |
| 6,156,980 A | * | 12/2000 | Peugh et al. ................. | 174/252 |
| 6,239,972 B1 | * | 5/2001 | Tehan et al. ................. | 361/704 |
| 6,349,033 B1 | * | 2/2002 | Dubin et al. ................. | 361/704 |
| 6,392,891 B1 | * | 5/2002 | Tzlil et al. ................... | 361/719 |

* cited by examiner

Primary Examiner—Gerald Tolin

(57) ABSTRACT

A printed circuit board is formed with a heat transfer region and at least one via in thermal communication with the region that transfers heat to the at least one region. A chassis is placed in thermal contact with the region so as to receive and dissipate heat from the region. A heat generating component is mounted on the printed circuit board so as to be in thermal communication with the at least one via. Thus, the heat generated by the component is transferred by the via to the region and subsequently dissipated by the chassis via convection.

4 Claims, 7 Drawing Sheets

MECHANICAL PACKAGING ARCHITECTURE FOR HEAT DISSIPATION

BACKGROUND OF THE INVENTION

Electrical devices, such as network testers, are often assembled in a chassis to form a package. Such packages provide many conveniences for users of the device, including protecting the circuits in the device from the environment and rough handling. Many electronic components of such electrical devices have an operating temperature limit, for example 110° C. in the case of many semiconductor devices. If the operating temperature limit is exceeded, the component may cease to operate in a definable manner and, at the extreme, may be damaged beyond repair. Most semiconductor devices generate a certain amount of heat during operation. Many semiconductor devices can generate enough heat to causes the temperature of the semiconductor to exceeds the operating temperature limit. Traditionally, two methods have been used to dissipate heat in electrical devices: heat sinks and fans.

A heat sink is a device designed to lower the temperature of an electronic device by dissipating heat into the surrounding air. Heat sinks are generally made of an aluminum alloy and often have fins on a first side to increase the surface area of the heat sink. A second side of such heat sinks, shaped to mate with a component, are attach to component. Basically, a heat sink conducts heat away from a component into the fins which are cooled by convection, e.g. the heat is transferred to the ambient air.

If, as is generally the case with traditional packages, the heat sink is internal of the chassis, the heated air needs to be exhausted to maintain the cycle of heat transfer from the heat sink to the ambient air. This can be done with strategically placed vents or fans.

Many problems are inherent with the use of heat sinks. Heat sinks are expensive and require a significant amount of labor to install. Obtaining maximum efficiency with a heat sink requires the use of compliant heat transfer material, such as thermal grease, between the second surface of the heat sink and the component. This is necessary to fill in any gaps between the heat sink and the component (the air in such gaps is not a particularly efficient heat transfer medium). The application of compliant heat transfer material to components tends to be costly and time consuming. Further, if vents are required, there is the problem of exposure of the components the outside environment, including contaminants and water, into the chassis. Finally, heat sinks tend to be quite large in comparison to the components that they are cooling, placing unwelcome constraints on package design.

The use of fans is also not without problems. Fans are expensive, increase unit maintenance, consume power, create heat, and generate electrical and acoustic noise. Fans also need access to external air, potentially exposing the unit to the outside environment.

The present inventors have discovered apparatus and methods for dissipating heat in packages which minimizes or eliminates the need for traditional heat sinks and fans.

BRIEF DESCRIPTION OF THE DRAWINGS

An understanding of the present invention can be gained from the following detailed description of the invention, taken in conjunction with the accompanying drawings of which.

DETAILED DESCRIPTION OF THE PREFERRED EMBODIMENT

Figure 1:
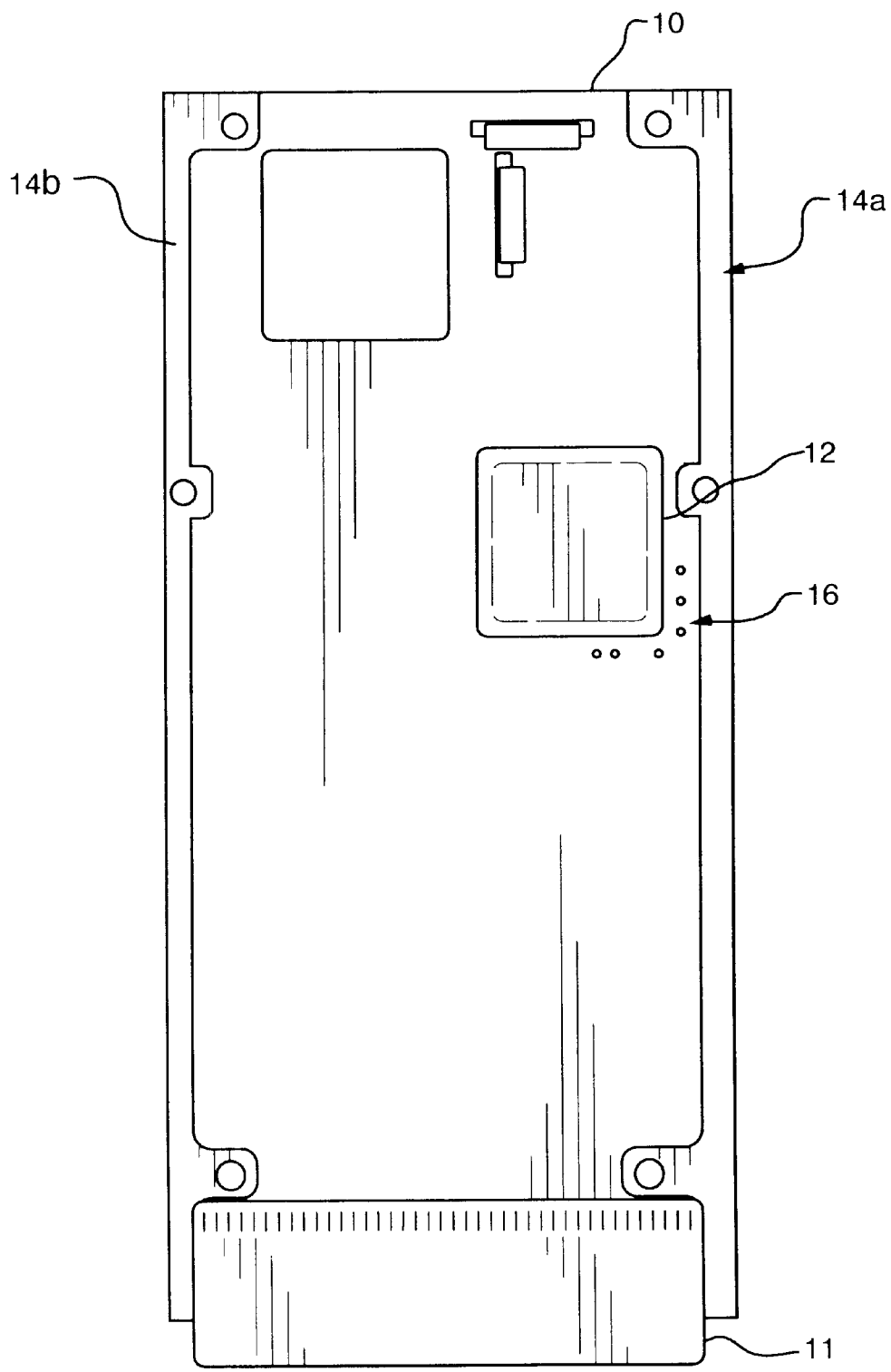
FIG. 1 is a plan view of a printed circuit board in accordance with a preferred embodiment of the present invention.

Reference will now be made in detail to the present invention, an example of which is illustrated in the accompanying drawings, wherein like reference numerals refer to like elements throughout.

The form factor of the apparatus used as an example in the present application is generally based on test modules for use with test devices, such as the AGILENT SERVICE ADVISOR, that provides a modular platform for copper, fiber loop and advanced services testing. While the form factor shown in the example that follows is particularly relevant to small form factor electronic packages, however, those of ordinary skill in the art will recognize that the methods and apparatus recited herein may be used to solve a variety of similar problems (heat dissipation with reduced reliance on heat sinks and fans) in other fields and other package types. The methods and apparatus presented herein are not inherently related to any particular electronic package.

FIG. 1 is a plan view of a printed circuit board ("PCB") 10 in accordance with a preferred embodiment of the present invention. It will be appreciated by those of ordinary skill in the relevant arts that the PCB 10, as illustrated in FIG. 1, and the configuration thereof as described hereinafter is intended to be generally representative such PCBs and that any particular PCB may differ significantly from that shown in FIG. 1, particularly in shape and layout. As such, the PCB 10 is to be regarded as illustrative and exemplary and not limiting as regards the invention described herein or the claims attached hereto.

The PCB 10 is designed to hold circuitry that forms a test module package to be connected to circuitry in a larger chassis, such as the AGILENT SERVICE ADVISOR, via an interface 11. The PCB 10, as show in FIG. 1 is highly simplified for purposes of explanation. As is known to those of ordinary skill in the art the PCB 10 comprises at least one base layer upon which a series of copper tracings is formed that interconnect components, such as a component 12. The component 12 is shown as an example of a heat generating component that requires heat dissipation for normal operation. The component 12 may be, for example, any heat producing electronic component including many integrated circuits such as amplifiers and transceivers.

In accordance with the present invention, the PCB 10 is provided with a heavy power plane (not shown) and a heavy ground plane (also not shown). The ground plane acts as a heat conduit and spreader region by receiving and collecting heat from the component 12 for transfer in a manner to be described herein below. The ground plain is preferably made from ½ ounce copper and/or has a nominal thickness of 0.006". The ground place is connected to etches 14*a* and 14*b* on the edge of the PCB 10. Etches 14*a* and 14*b* are sometimes referred to herein as transfer zones. Major heat producing components, such as the component 12, are tied to a heavy ground plane with vias 16.

In accordance with the preferred embodiment of the present invention, the vias 16 conduct the heat generated by the component 12 to the ground plane which is used as a heat spreader and a conduit to move heat from the component 12 to the etches 14*a* and 14*b*. The etches 14*a* and 14*b* act as transfer zones by collecting heat generated by the component 12 and transferring said heat in a manner to be described herein below. The power planes (not shown) are split between voltages and run almost the entire length and width of the PCB. Preferably, the power planes are separated by at least 1 mm from the etches 14*a* and 14*b* to reduce the possibility of a short circuit. In accordance with the preferred embodiment of the present invention, the power plane may be also used as a heat spreader. Those of ordinary skill in the art will also recognize that any suitably sized region of copper material (or other thermally conductive material) may be used instead of or in conjunction with the etches 14*a* and 14*b*. Further, there is no particular requirement (outside of efficiency) that such region serve any other function within the circuit.

Physically, the vias 16 range in size from 0.010" to 0.020". In accordance with the preferred embodiment of the present invention vias 16 having a diameter of either 0.010" & 0.013". are used around the heat producing components, such as the component 12. However, the number, size and location of vias 16 may vary depending on the available space. Preferably, 0.020" vias (not shown) are used to connect the ground plane to the etches 14*a* and 14*b*. The vias that connect the ground plane to the etches 14*a* and 14*b* are spaced 14 mm apart where internal layers permit. Thus, in a PCB having dimensions of 83 mm×179 mm, twenty-two (22) vias connect the ground plane with the etches 14*a* and 14*b*. Normally, the vias 16 are drilled through holes that are plated through to connect the applicable layers.

Figure 2:
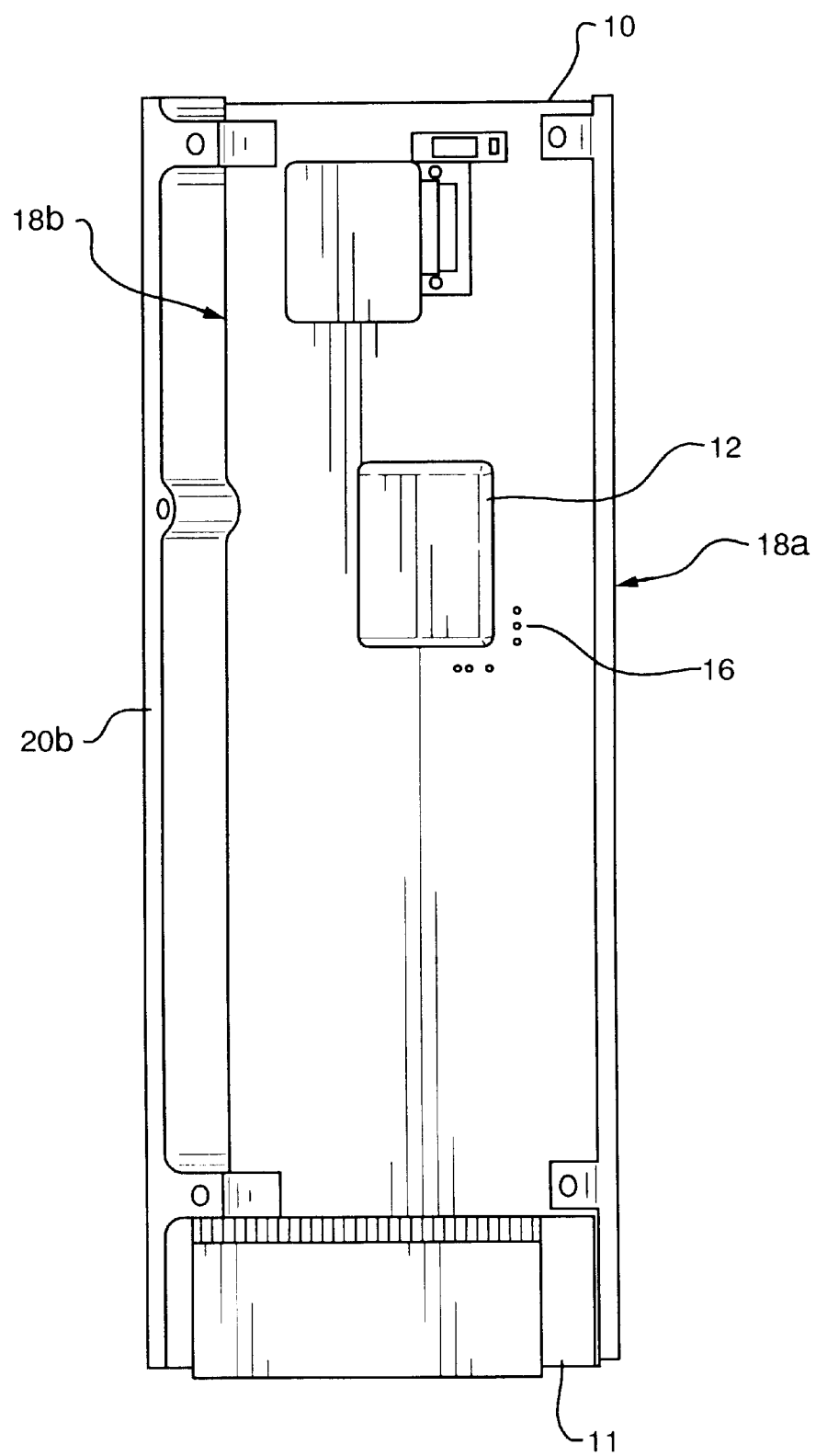
FIG. 2 is a an isometric view of a printed circuit board in accordance with a preferred embodiment of the present invention.

FIG. 2 is a an isometric view of a printed circuit board in accordance with a preferred embodiment of the present invention. The PCB 10 is prepared for assembly into an assembled package by laying strips of phase change material 18*a* and 18*b* over the etches 14*a* and 14*b*. The phase change material 18*a* and 18*b* preferably comprises a paraffin based material. Guide rails 20*a* (not shown) and 20*b*, preferably formed of cast zinc, are then placed over the strips of phase change material 18*a* and 18*b*, respectively. The phase change material melts as the surface temperate of the PCB increases, filling in any air gaps between the guide rails 20*a* and 20*b* and the PCB 10. The guide rails 20*a* and 20*b* absorb the heat stored in the etches 14*a* and 14*b*. In general, phase change material is much easier to use than compliant heat transfer material as it may be die cut to fit exactly under the guide rails 20 and assembled with little effort. Compliant heat transfer material could be used, but at the cost of requiring individualized dispensing and spreading operations.

Figure 3:
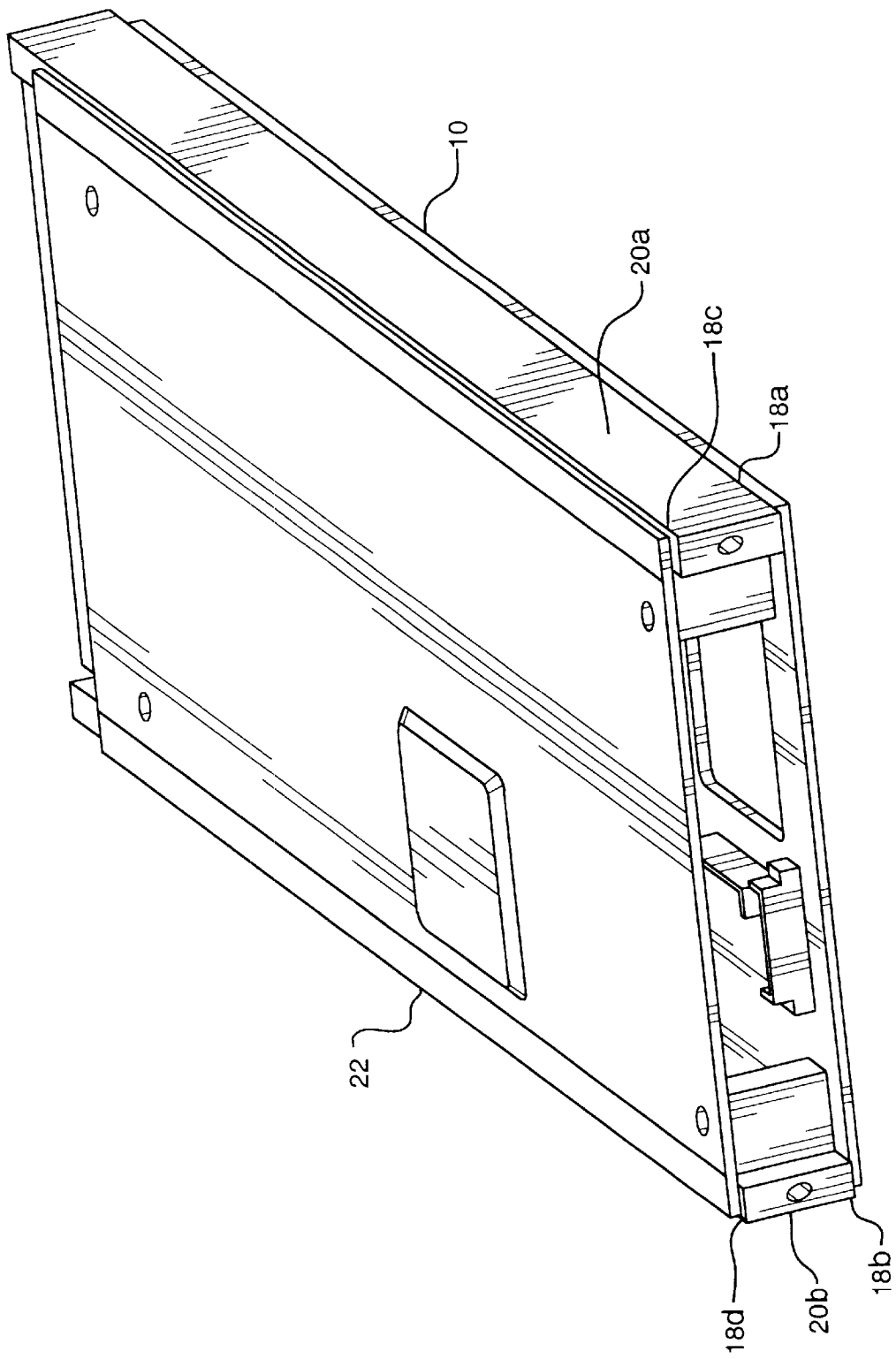
FIG. 3 is an isometric view of a printed circuit board assembly in accordance with a preferred embodiment of the present invention.

FIG. 3 is an isometric view of a printed circuit board assembly in accordance with a preferred embodiment of the present invention. As shown in FIG. 3 an optional second PCB 22 is placed on the guide rails 20*a* and 20*b* opposite the PCB 10. Similar to the connection method for the PCB 10, strips of phase change material 18*c* and 18*d* are layered between the second PCB 22 and the guide rails 20*a* and 20*b*.

Figure 4:
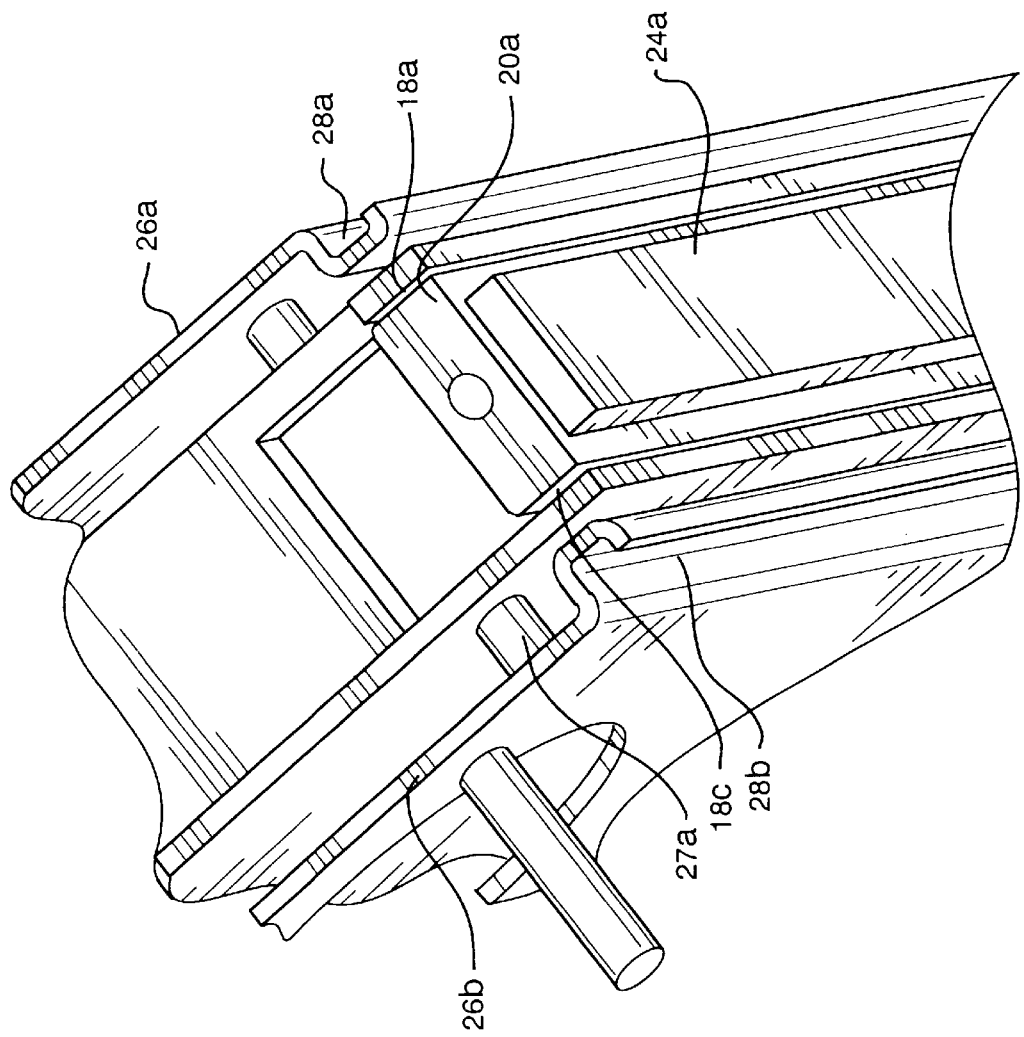
FIG. 4 is a partial isometric view of a partially assembled package in accordance with a preferred embodiment of the present invention.

FIG. 4 is a partial isometric view of a partially assembled package in accordance with a preferred embodiment of the present invention. Each of the guide rails 20*a* and 20*b* receives a layer of compliant heat sink material 24*a* and 24*b* (not shown) on an outside surface thereof. The dispensing and spreading operations in this location do not require the same precision as when applying compliant heat sink material to a component on the a PCB, making the operation less critical and less time consuming. Two chassis halves 26*a* and 26*b* are placed next to the outside surfaces of the PCBs 10 and 22. In the example shown in FIG. 4, the chassis halves 26*a* and 26*b* have posts 27*n* (27*a* shown) extending through holes in the PCBs 10 and 22 and the guide rails 20*a* and 20*b* to provide lateral indexing of the components in the package. The chassis halves 26*a* and 26*b* are provided with channels 28*a* and 28*b*, respectively, that run parallel with the guide rail 20*a*. It will be recognized by those of ordinary skill in the art that the opposite edge of the chassis halves 26*a* and 26*b* are provided with similar channels parallel with the guide rail 20*b*.

By way of example, a power plane 40 and a ground pane 42 are illustrated on the PCB 10. Those of ordinary skill in the art are familiar with ground and power planes and as such further discussion will be dispensed with.

Figure 5:
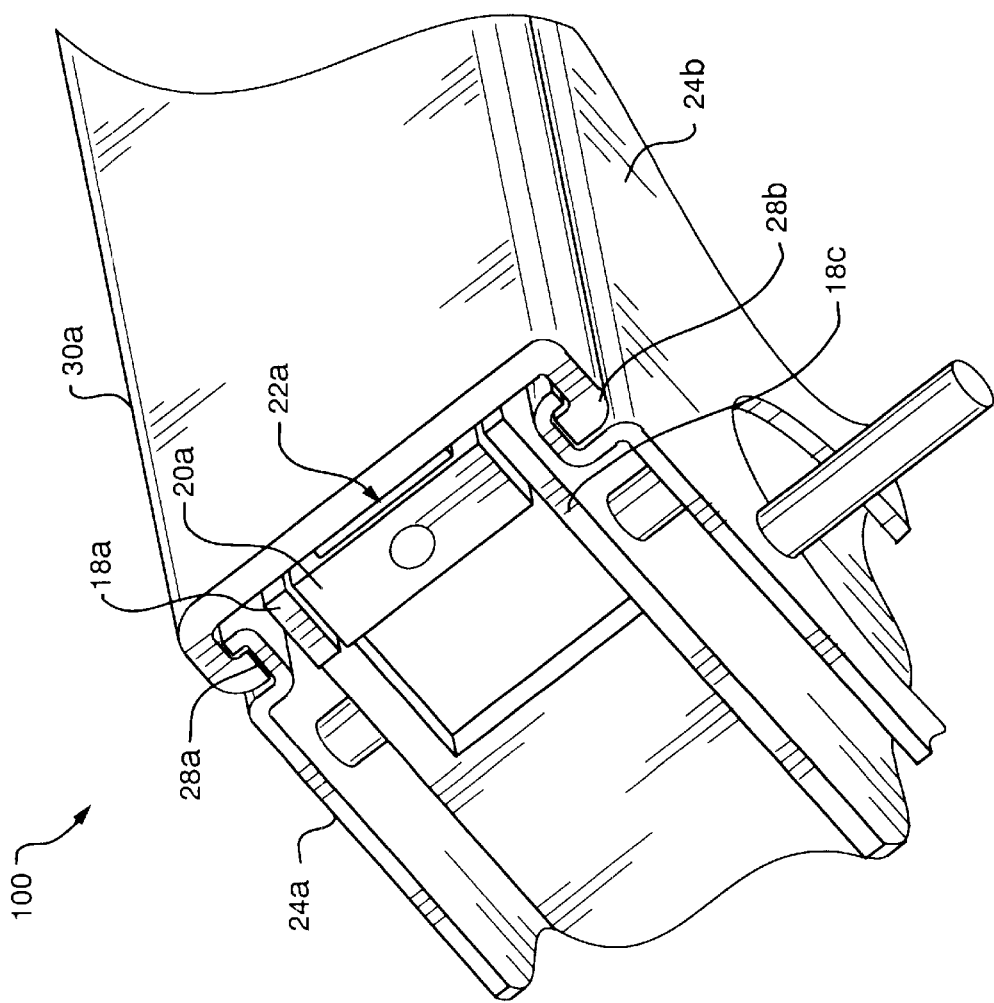
FIG. 5 is a partial isometric view of an assembled package in accordance with a preferred embodiment of the present invention.

FIG. 5 is a partial isometric view of an assembled package in accordance with a preferred embodiment of the present invention. A C-shaped rail lock 30*a*, preferably constructed of extruded 6063-H5 aluminum, is slid over the channels 28*a* and 28*b* so as to bias the chassis halves toward each other thereby indexing the PCB 10 and 22 vertically. In accordance with the preferred embodiment of the present invention, heat is transferred, aided by the compliant heat sink material 24*a*, between the rail guide 20*a* and the rail lock 30*a*. In other words, heat generated by the component 12 is drawn into the structural support and transferred to an outside portion of the package for dissipation by convection.

Figure 6:
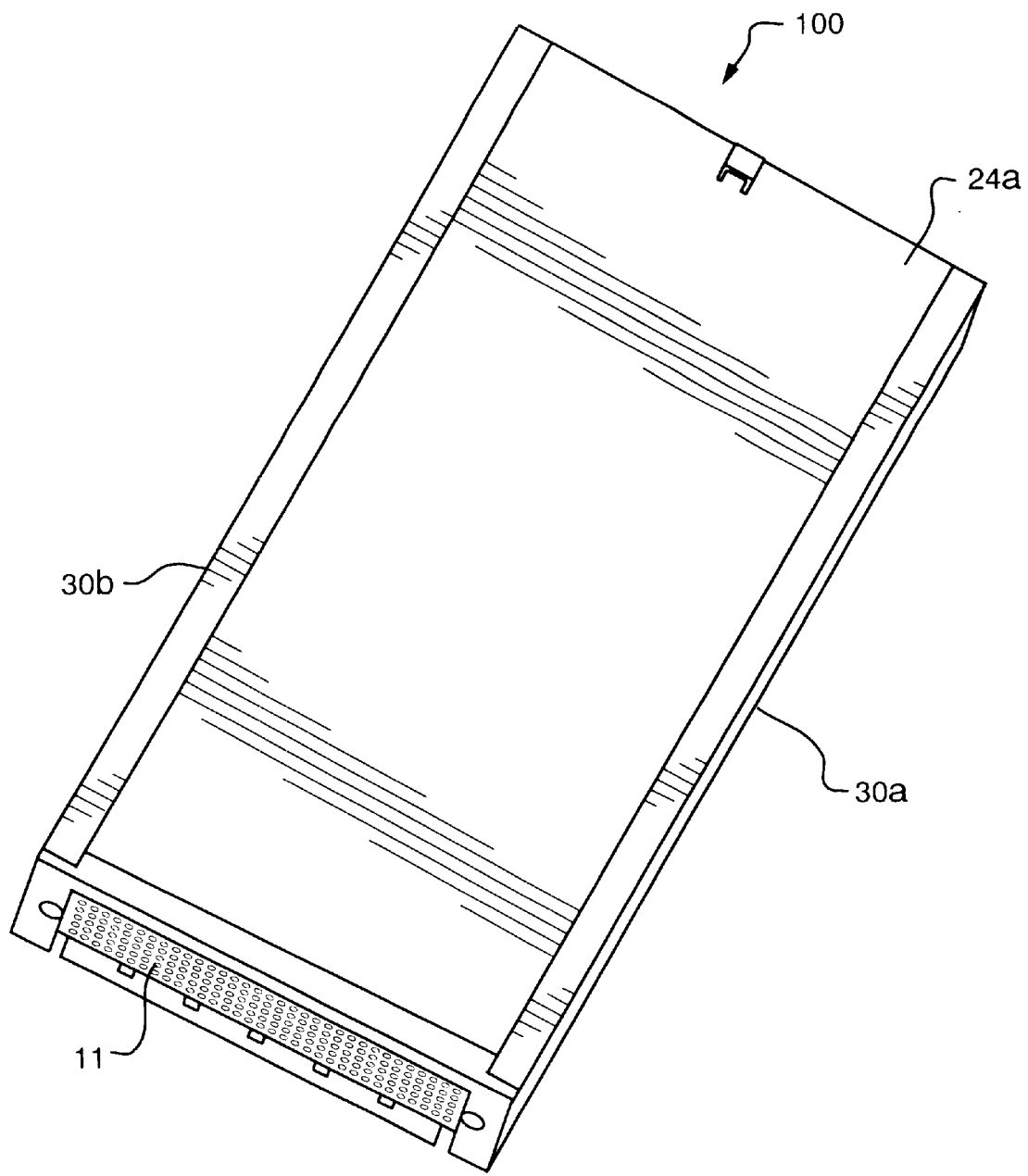
FIG. 6 is an isometric view of an assembled package in accordance with a preferred embodiment of the present invention.

FIG. 6 is an isometric view of an assembled package 100 in accordance with a preferred embodiment of the present invention. Heat generated by the component 12 is transferred by vias 16 to ground plane and etches 14*a* and 14*b*. Subsequently, heat is transferred to the rail locks 30*a* and 30*b* by way of the rail guides 20*a* and 20*b*. Phase change material 18 is added between the etches 14*a* and 14*b* and the guide rails 20 to increase the thermal efficiency of the transfer there between while compliant heat sink material 24 is added between the guide rails 20 and the rail locks 30 to increase the thermal efficiency of the transfer there between. Heat in the rail locks 30 is dissipated into the ambient air via convection.

Figure 7:
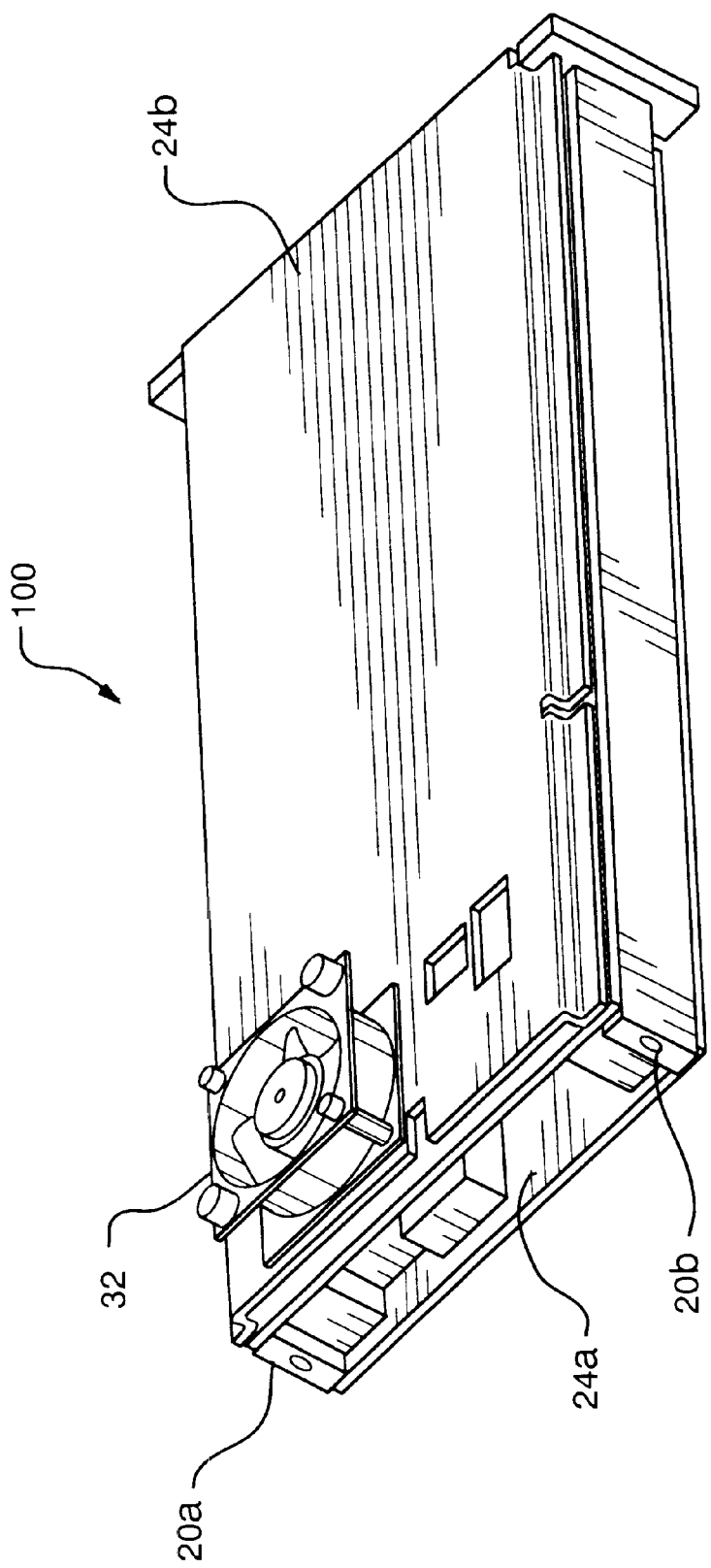
FIG. 7 is an isometric view of an assembled package in accordance with a preferred embodiment of the present invention.

FIG. 7 is an isometric view of an assembled package in accordance with a preferred embodiment of the present invention. In accordance with the present invention, the majority of the heat in the assembled package 100 is cooled by convection, eliminating the need for vents to permit the escape of heat from the component 12 (not shown). This facilitates protecting the component 12 from environmental hazards such as liquid and dust. Tests have shown that an assembled package 100 is capable of dissipating approximately 15 watts in a volume that would normally dissipate only 8 watts with a normal heat sink. However, if further dissipation is required a small fan 32 can be added. Because of the efficiency of the dissipation, the fan 32 can be much smaller that would be required with the use of a normal heat sink. Consequentially, a package 100 in accordance with the preferred embodiment of the present invention requires smaller vents than would otherwise be necessary thereby minimizing the impact of the outside environment on the inside of the chassis.

Although a few preferred embodiments of the present invention has been discussed, it will be appreciated by those skilled in the art that changes may be made in such embodiments without departing from the principles and spirit of the invention, the scope of which is defined in the claims and their equivalents.

What is claimed is:

1. A printed circuit board assembly comprising:
   a printed circuit board having a heat transfer region and at least one via in thermal communication with the region that transfers heat to the at least one region;
   a heat generating component mounted on the printed circuit board so as to be in thermal communication with the at least one via wherein the heat generated by the component is transferred by the via to the region;
   at least one transfer zone, formed on a surface of an edge of the printed circuit board, in thermal communication with the region that enables the heat transfer from the region;
   a chassis having:
     a rail in thermal communication with the at least one transfer zone so as to receive heat from the heat generating component the chassis dissipating heat received from the region via convection;
   a first shell half positioned above the printed circuit board;
   a second shell half positioned below the printed circuit board; and
   a rail lock that biases the first shell half toward the second shell half securing the printed circuit board and the rail there between.

2. The printed circuit board assembly, as set forth in claim 1, further comprising a layer of compliant heat sink material situated between the rail and the rail lock, the compliant heat sink material thermally connecting the rail to the rail lock, whereby the rail lock is in Thermal communication with the component and dissipates the heat generated by the component through convection.

3. A printed circuit board assembly comprising;
   a printed circuit board having a heavy plane and a printed surface region that receives heat from the heavy plane;
   a heat generating component mounted on the printed circuit board so as to be in thermal communication with the heavy plane wherein the heat generated by the component is transferred to the heavy plane;
   a chassis including a heat transfer portion in thermal communication with the printed surface region, the chassis receiving heat generated by the component and dissipating the received heat via convection; and
   a layer of phase change material thermally connecting the printed surface region of the printed circuit board to the heat transfer portion of the chassis.

4. The printed circuit board assembly, as set forth in claim 3, further comprising:
   a tan that assists with heat dissipation.

* * * * *